(12) United States Patent
Choi et al.

(10) Patent No.: US 12,310,202 B2
(45) Date of Patent: May 20, 2025

(54) DISPLAY WITH OVERLAPPING CONDUCTIVE LINES HAVING A BRIDGE PORTION

(71) Applicant: LG Display Co., Ltd., Seoul (KR)

(72) Inventors: Howon Choi, Paju-si (KR); Dohong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 706 days.

(21) Appl. No.: 17/510,283

(22) Filed: Oct. 25, 2021

(65) Prior Publication Data
US 2022/0130945 A1 Apr. 28, 2022

(30) Foreign Application Priority Data
Oct. 28, 2020 (KR) .................. 10-2020-0141301

(51) Int. Cl.
*H01L 27/32* (2006.01)
*H10K 59/122* (2023.01)
*H10K 59/131* (2023.01)

(52) U.S. Cl.
CPC ....... *H10K 59/1315* (2023.02); *H10K 59/122* (2023.02)

(58) Field of Classification Search
CPC .............................................. H10K 59/1315
See application file for complete search history.

(56) References Cited

U.S. PATENT DOCUMENTS

| 9,299,759 | B2 | 3/2016 | Park et al. | |
|---|---|---|---|---|
| 2009/0146930 | A1* | 6/2009 | Nishimura | ......... H10K 59/1213 345/80 |
| 2012/0169647 | A1* | 7/2012 | Kuo | ....................... G06F 3/0446 345/174 |
| 2014/0231764 | A1 | 8/2014 | Park et al. | |
| 2016/0172430 | A1 | 6/2016 | Park et al. | |
| 2020/0176527 | A1* | 6/2020 | An | ....................... G09G 3/3233 |

FOREIGN PATENT DOCUMENTS

| CN | 108899339 A | * | 11/2018 | ........... G06K 9/0004 |
|---|---|---|---|---|
| CN | 111929954 A | * | 11/2020 | |
| CN | 113948553 A | * | 1/2022 | ........... G09G 3/3225 |
| KE | 10-2012-0042330 A | | 5/2012 | |
| KR | 10-2014-0104263 A | | 8/2014 | |
| KR | 10-2015-0064482 A | | 6/2015 | |

* cited by examiner

*Primary Examiner* — Peter Bradford
(74) *Attorney, Agent, or Firm* — Fenwick & West LLP

(57) ABSTRACT

A display panel in which a bridge portion is included in any one of two signal lines at its intersection area, and a display apparatus using the same. The display panel comprises a substrate, a first signal line along a first direction, a first insulating film covering the first signal line, a second signal line along a second direction different from the first direction, a second insulating film covering the first insulating film, and a first pixel electrode on the second insulating film, wherein the second signal line includes an extension line, a connection line, an overlapping line, and a bridge portion connected to the extension line, the connection line, and the overlapping line through contact holes disposed on the second insulating film.

11 Claims, 10 Drawing Sheets

DISPLAY WITH OVERLAPPING CONDUCTIVE LINES HAVING A BRIDGE PORTION

CROSS-REFERENCE TO RELATED APPLICATIONS

This application claims the benefit of the Korean Patent Application No. 10-2020-0141301 filed on Oct. 28, 2020, which is hereby incorporated by reference as if fully set forth herein.

BACKGROUND

Field of the Invention

The present disclosure relates to a display panel and a display apparatus using the same.

Discussion of the Related Art

A display apparatus includes a liquid crystal display apparatus and a light emitting display apparatus, and the display apparatus includes a display panel configured to output an image.

As the display panel displays a high resolution, and the number of masks used in the display panel is reduced, a resistance-capacitor load (RC Load) in the display panel is increased, whereby a degradation of an image quality occurs due to a degradation of a charge rate.

In particular, as an overlap area between two lines intersecting each other increases, a parasitic capacitance between the two lines increases, thereby increasing the RC load in the display panel.

SUMMARY

The present disclosure has been made in view of the above problems, and it is an object of the present disclosure to provide a display panel in which a bridge portion is included in any one of two signal lines at its intersection area, and a display apparatus using the same.

In accordance with an aspect of the present disclosure, the above and other objects can be accomplished by the provision of a display panel comprising a substrate, a first signal line disposed along a first direction of the substrate and provided on the substrate, a first insulating film disposed on the substrate and configured to cover the first signal line, a second signal line disposed along a second direction different from the first direction, a second insulating film configured to cover the first insulating film, and a first pixel electrode disposed on the second insulating film and electrically connected to a transistor disposed on the first insulating film, wherein the second signal line includes an extension line disposed on a first side of the first signal line with respect to the first signal line which intersects the second signal line and provided on the first insulating film, a connection line disposed on a second side of the first signal line and provided on the first insulating film, an overlapping line disposed on the first insulating film and overlapped with the first signal line, and a bridge portion disposed on the second insulating film and connected to the extension line, the connection line and the overlapping line through contact holes disposed on the second insulating film.

In accordance with another aspect of the present disclosure, there is provided a display panel comprising a substrate, a first signal line disposed along a first direction of the substrate and provided on the substrate, a first insulating film disposed on the substrate and configured to cover the first signal line, a second signal line disposed along a second direction different from the first direction, a second insulating film configured to cover the first insulating film, and a first pixel electrode disposed on the second insulating film and electrically connected to a transistor disposed on the first insulating film, wherein the second signal line includes an extension line disposed on a first side of the first signal line with respect to the first signal line which intersects the second signal line and provided on the first insulating film, a connection line disposed on a second side of the first signal line and provided on the first insulating film, and a bridge portion disposed on the second insulating film and connected to the extension line and the connection line through contact holes disposed on the second insulating film.

In accordance with another aspect of the present disclosure, there is provided a display panel comprising: a substrate; a first signal line disposed along a first direction of the substrate and provided on the substrate; a first insulating film disposed on the substrate and configured to cover the first signal line; a second signal line disposed along a second direction different from the first direction; and a second insulating film configured to cover the first insulating film, wherein the second signal line includes: a plurality of lines separated from each other provided on the first insulating film; and a bridge portion disposed on the second insulating film, wherein the bridge portion is connected to the plurality of lines through contact holes disposed on the second insulating film.

In accordance with another aspect of the present disclosure, there is provided a display apparatus comprising: a display panel according to the present disclosure; a data driver configured to supply data voltages to data lines disposed in the display panel; a gate driver configured to supply gate voltages to gate lines disposed in the display panel; and a controller configured to control the data driver and the gate driver.

In addition to the effects of the present disclosure as mentioned above, additional objects of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
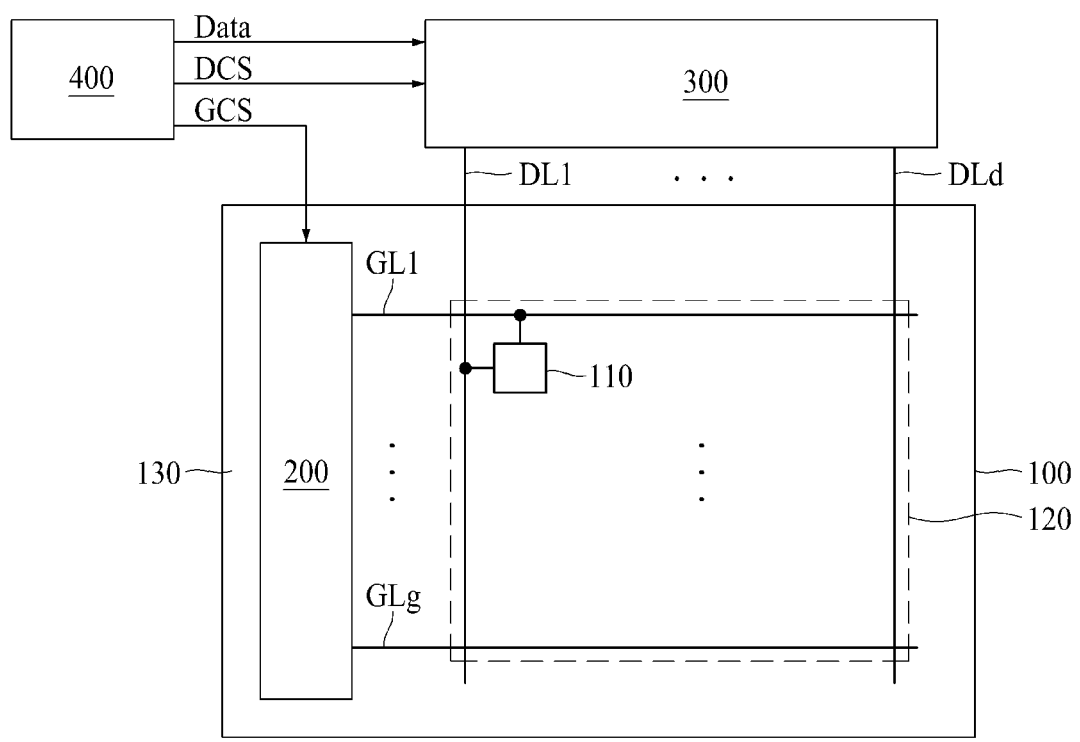
FIG. 1 illustrates a display apparatus according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after', 'subsequent', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display panel according to the present disclosure and a display apparatus using the same will be described in detail with reference to the accompanying drawings. In the drawings, the same or similar elements are denoted by the same reference numerals even though they are depicted in different drawings.

Hereinafter, embodiments of the present disclosure will be described in detail with reference to the accompanying drawings.

Figure 2A:
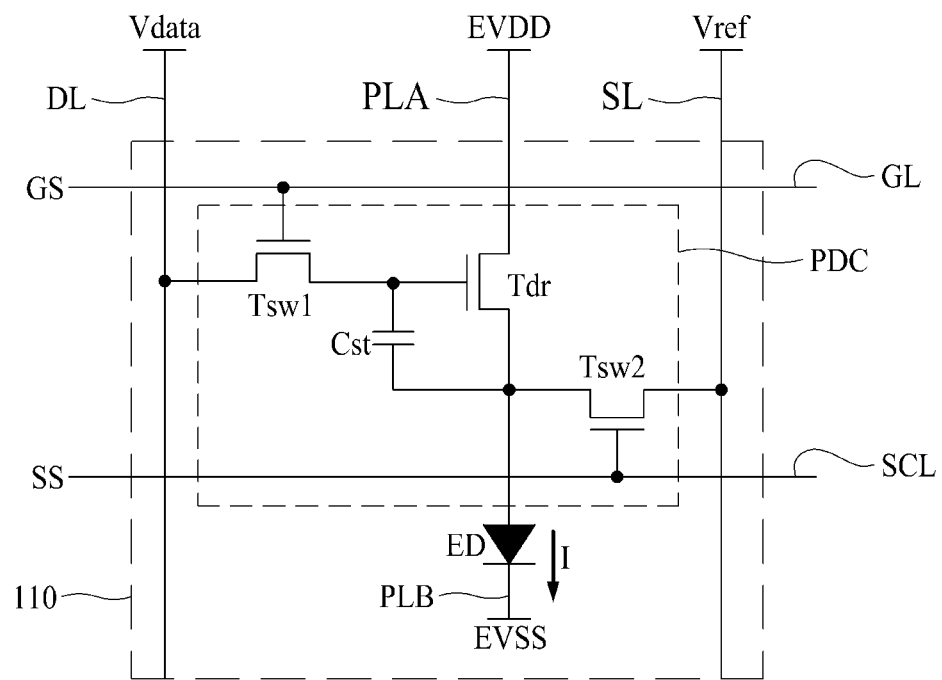
FIGS. 2A and 2B illustrate a pixel structure applied to the display apparatus according to the present disclosure.
Figure 2B:
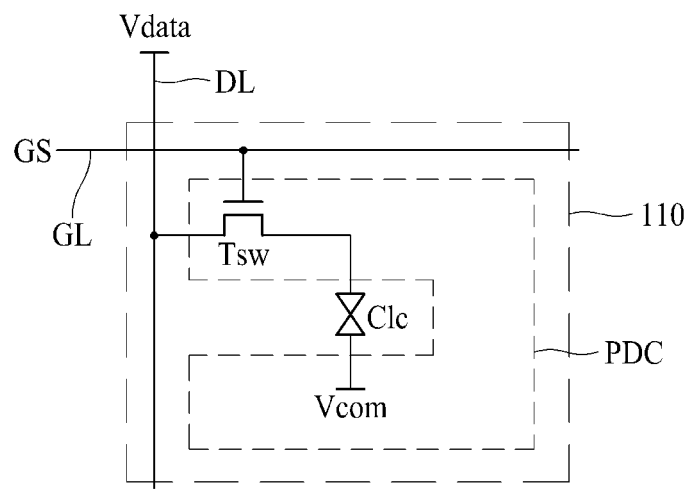

FIG. 1 illustrates a display apparatus according to an embodiment of the present disclosure. FIGS. 2A and 2B illustrate a pixel structure applied to the display apparatus according to the present disclosure.

The display apparatus according to the present disclosure may constitute various electronic devices. For example, the electronic device may be a smart-phone, a tablet PC, a television, a monitor, and the like.

As shown in FIG. 1, the display apparatus according to the present disclosure includes a display panel 100 including a display area 120 configured to output an image and a non-display area 130 provided in the periphery of the display area, a gate driver 200 configured to supply gate signals to gate lines GL1 to GLg provided in the display area of the display panel 100, a data driver 300 configured to supply data voltages to data lines DL1 to DLd provided in the display panel, and a controller 400 configured to control an operation in each of the gate driver 200 and the data driver 300.

First, the display panel 100 includes the display area 120 and the non-display area 130. In the display area 120, there are the gate lines GL1 to GLg, the data lines DL1 to DLd, and pixels 110.

The display panel 100 may be a light emitting display panel composed of a light emitting device ED, or may be a liquid crystal display panel which displays an image by the use of liquid crystal.

Referring to FIG. 2A, when the display panel 100 is the light emitting display panel, the pixel 110 included in the display panel 100 may include the light emitting device ED, a switching transistor Tsw1, a storage capacitor Cst, a driving transistor Tdr, and a sensing transistor Tsw2. That is, the pixel 110 includes a pixel driving circuit PDC and a light emitting portion, and the pixel driving circuit PDC may include the switching transistor Tsw1, the storage capacitor Cst, the driving transistor Tdr, and the sensing transistor Tsw2. And, the light emitting portion may include the light emitting device ED.

The light emitting device ED may include any one of an organic light emitting layer, an inorganic light emitting layer, and a quantum dot light emitting layer. Alternatively, the light emitting device ED may include a stack or mixed structure of the organic light emitting layer (or inorganic light emitting layer) and the quantum dot light emitting layer.

The switching transistor Tsw1 constituting the pixel driving circuit PDC may be turned on or off by the gate signal GS supplied to the gate line GL. The data voltage Vdata supplied through the data line DL is supplied to the driving transistor Tdr when the switching transistor Tsw1 is turned on. A first voltage EVDD may be supplied to the driving transistor Tdr and the light emitting device ED through a first voltage supply line PLA. And, a second voltage EVSS is supplied to the light emitting device ED through a second voltage supply line PLB. The sensing transistor Tsw2 may be turned on or off by a sense control signal SS supplied through a sensing control line SCL. And, a sensing line SL may be connected to the sensing transistor Tsw2. A reference voltage Vref may be supplied to the pixel 110 through the sensing line SL. The sensing signal related with the characteristic change of the driving transistor Tdr may be transmitted to the sensing line SL through the sensing transistor Tsw2.

Although the light emitting display panel according to the present disclosure may be formed in the structure shown in FIG. 2A, the present disclosure is not limited thereto. Accordingly, the light emitting display panel according to the present disclosure may be changed in various types in addition to the structure shown in FIG. 2A.

Referring to FIG. 2B, when the display panel 100 is the liquid crystal display panel, the pixel 110 included in the display panel 100 may include a switching transistor Tsw, a common electrode, and liquid crystal. For example, the pixel 110 may include a pixel driving circuit PDC, and a light emitting portion. The pixel driving circuit PDC may include the switching transistor Tsw and the common electrode Vcom. Also, the light emitting portion may include liquid crystal. In FIG. 2B, the reference numeral "Clc" denotes a storage capacitance formed in the liquid crystal by a pixel voltage supplied to a pixel electrode connected to the switching transistor Tsw and a common voltage Vcom supplied to the common electrode.

When the display panel 100 is the liquid crystal display panel, the display apparatus may further include a backlight configured to emit light to the liquid crystal display panel.

The display panel 100 may form a pixel area in which the pixels 110 are formed. In the display panel 100, there are signal lines configured to provide various signals to the pixel driving circuit PDC provided in the pixel 110.

For example, in the light emitting display panel including the pixel 110 as shown in FIG. 2A, the signal lines may include the gate line GL, the data line DL, the sensing control line SCL, the first voltage supply line PLA, the second voltage supply line PLB, and the sensing line SL.

In addition, in the liquid crystal display panel including the pixel 110 as shown in FIG. 2B, the signal lines may include the gate line GL and the data line DL.

Then, the data driver 300 may be provided on a chip-on film attached to the display panel 100. And, the data driver 300 may be connected to a main board provided with the controller 400. In this case, lines for electrically connecting the data driver 300 and the display panel 100 may be provided in the chip-on-film. To this end, the lines are electrically connected to pads provided in the display panel 100 and the main board. The main board is electrically connected to an external substrate on which an external system is mounted.

The data driver 300 may be directly mounted on the display panel 100 and may be electrically connected to the main board.

However, the data driver 300 may be formed with one integrated circuit together with the controller 400. And, the integrated circuit may be provided on the chip-on film or directly mounted on the display panel 100.

The external system performs a function of driving the controller 400 and electronic device. For example, when the electronic device is a smart phone, the external system may receive various voice information, image information, and text information through a wireless communication network, and transmit the received image information to the controller 400. The image information may be input image data.

When the display panel 100 is the light emitting display panel, the data driver 300 may receive the sensing signal related with the characteristic change of the driving transistor Tdr provided in the light emitting display panel from the light emitting display panel, and may transmit the sensing signal to the controller 400.

Next, the gate driver 200 may be composed of an integrated circuit, and then may be integrated with the non-display area 130. Alternatively, the gate driver 200 may be directly embedded in the non-display area 130 by a gate-in-panel (GIP) method. If using the gate-in-panel (GIP) method, transistors constituting the gate driver 200 may be provided in the non-display area 130 through the same process as transistors provided in each of the pixels 110 of the display area 120.

When a gate pulse generated in the gate driver 200 is supplied to a gate of the switching transistor Tsw1 or Tsw provided in the pixel 110, the switching transistor is turned on. Accordingly, light may be outputted from the pixel. When a gate-off signal is supplied to the switching transistor Tsw1 or Tsw, the switching transistor is turned off. Accordingly, light is not outputted from the pixel. The gate signal GS supplied to the gate line GL includes the gate pulse and the gate-off signal.

Finally, the controller 400 may re-align the input image data transmitted from the external system by the use of timing synchronized signal transmitted from the external system. In addition, the control unit 400 may include a data aligner configured to supply the re-aligned image data to the data driver 300, a control signal generator configured to generate a gate control signal GCS and a data control signal DCS by the use of timing synchronized signal, an input portion configured to receive the timing synchronized signal and input image data transmitted from the external system and to transmit the received timing synchronized signal and input image data to the data aligner and the control signal generator, and an output portion configured to output the image data Data generated in the data aligner and the control signals DCS and GCS generated in the control signal generator to the data driver 300 or the gate driver 200.

The controller 400 may be embedded in the display panel 100. Alternatively, the controller 400 may further perform a function of analyzing touch sensing signals received through a touch panel attached to the display panel 100 and sensing whether or not there is a touch and a touch position.

Hereinafter, as shown in FIG. 2A, the light emitting display panel including the light emitting device ED is described as an example of the display panel according to the present disclosure.

Figure 3:
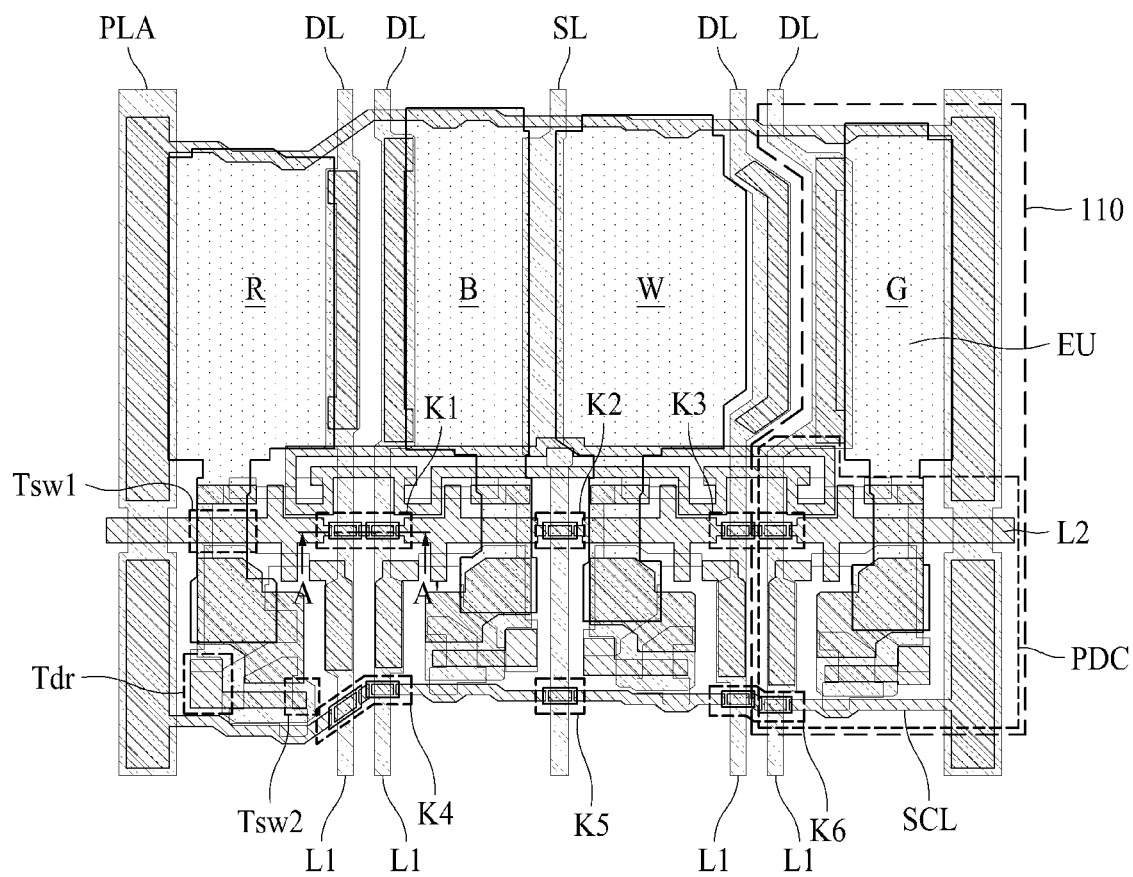
FIG. 3 illustrates four pixels of a display panel according to the present disclosure.
Figure 4:
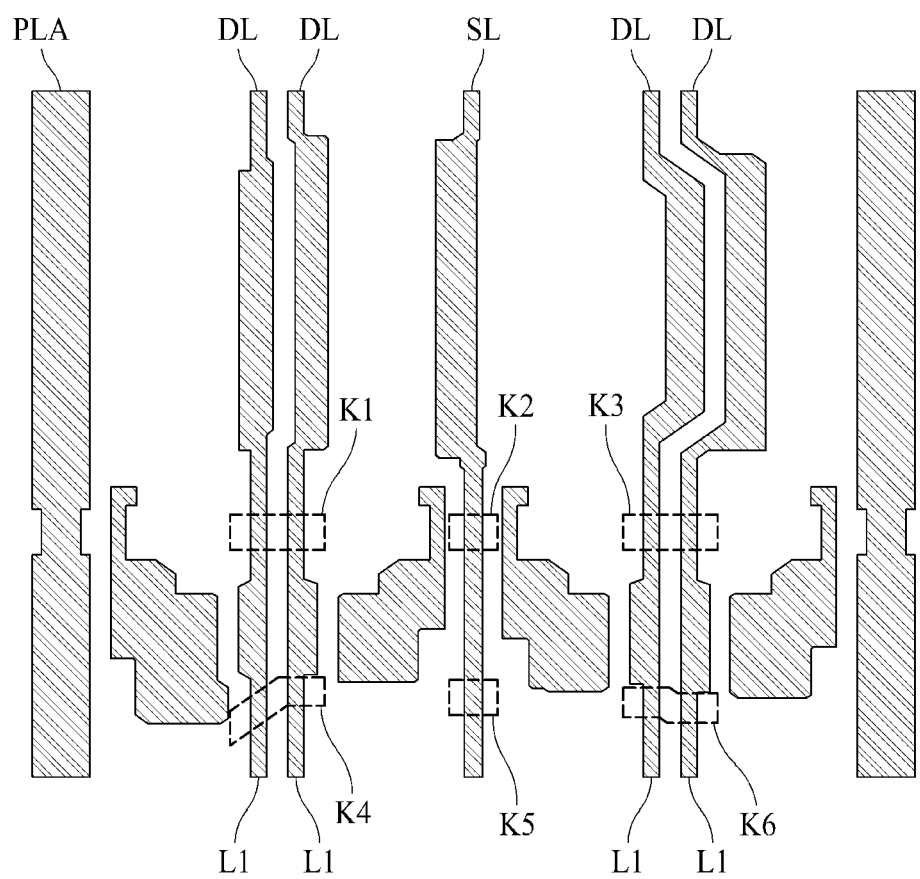
FIG. 4 illustrates first panel electrodes provided in the pixels shown in FIG. 3.
Figure 5:
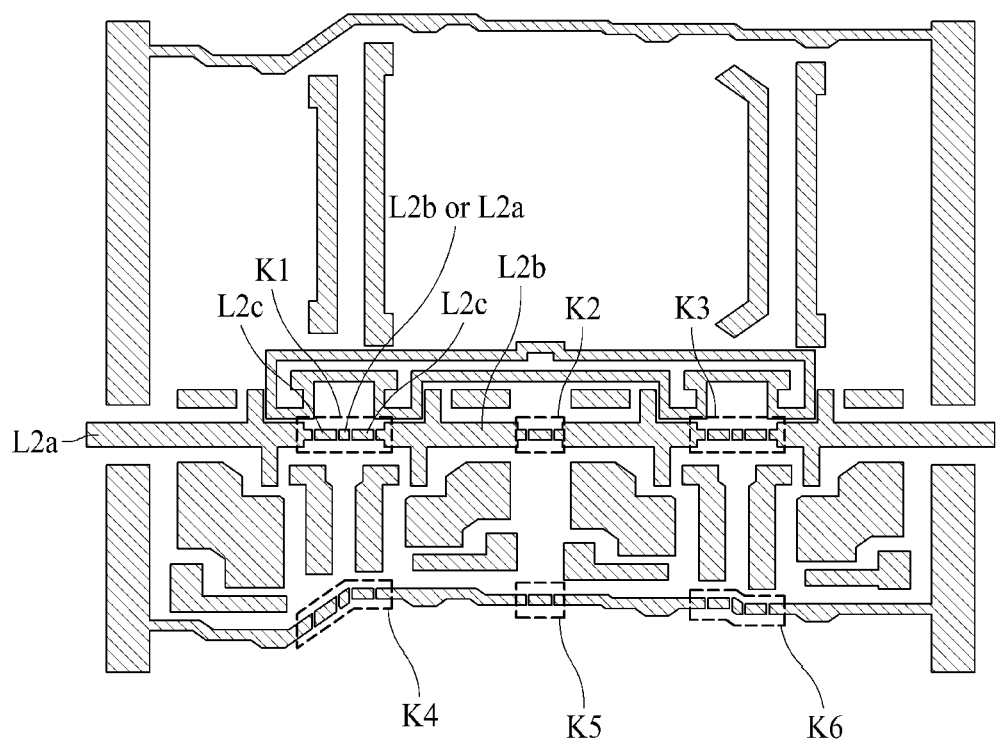
FIG. 5 illustrates second panel electrodes provided in the pixels shown in FIG. 3.
Figure 6:
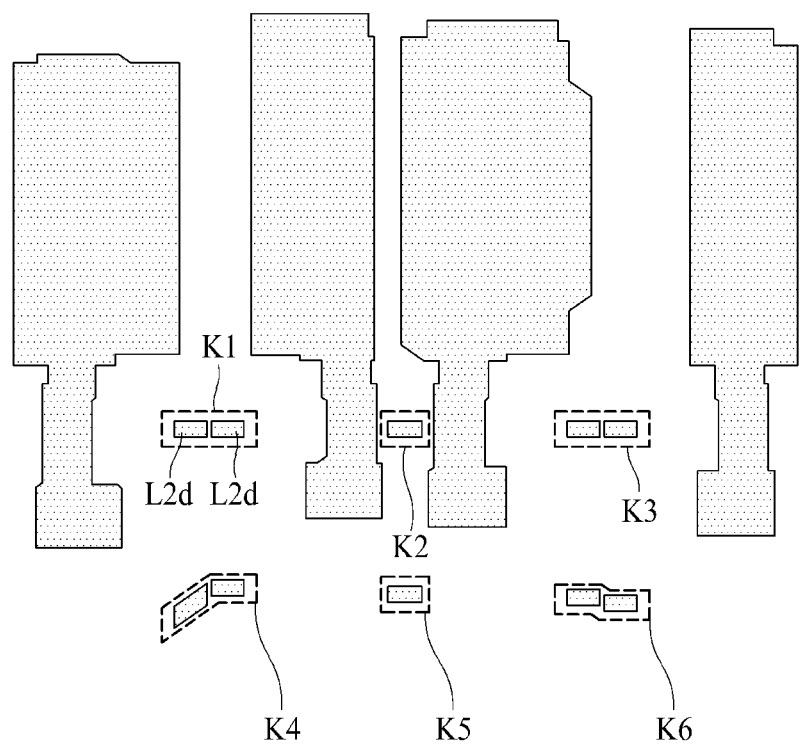
FIG. 6 illustrates third panel electrodes provided in the pixels shown in FIG. 3.
Figure 7A:
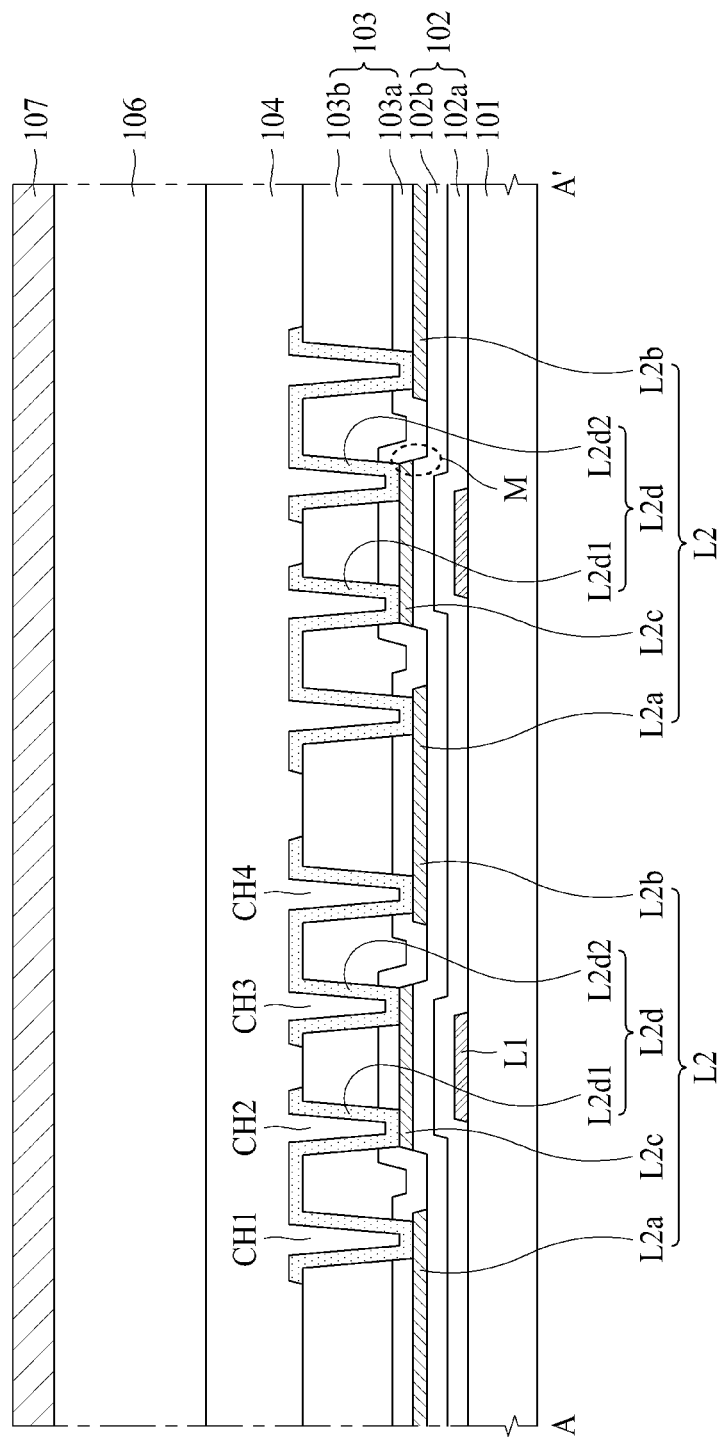
FIGS. 7A and 7B are cross sectional views along A-A' of FIG. 3.
Figure 7B:
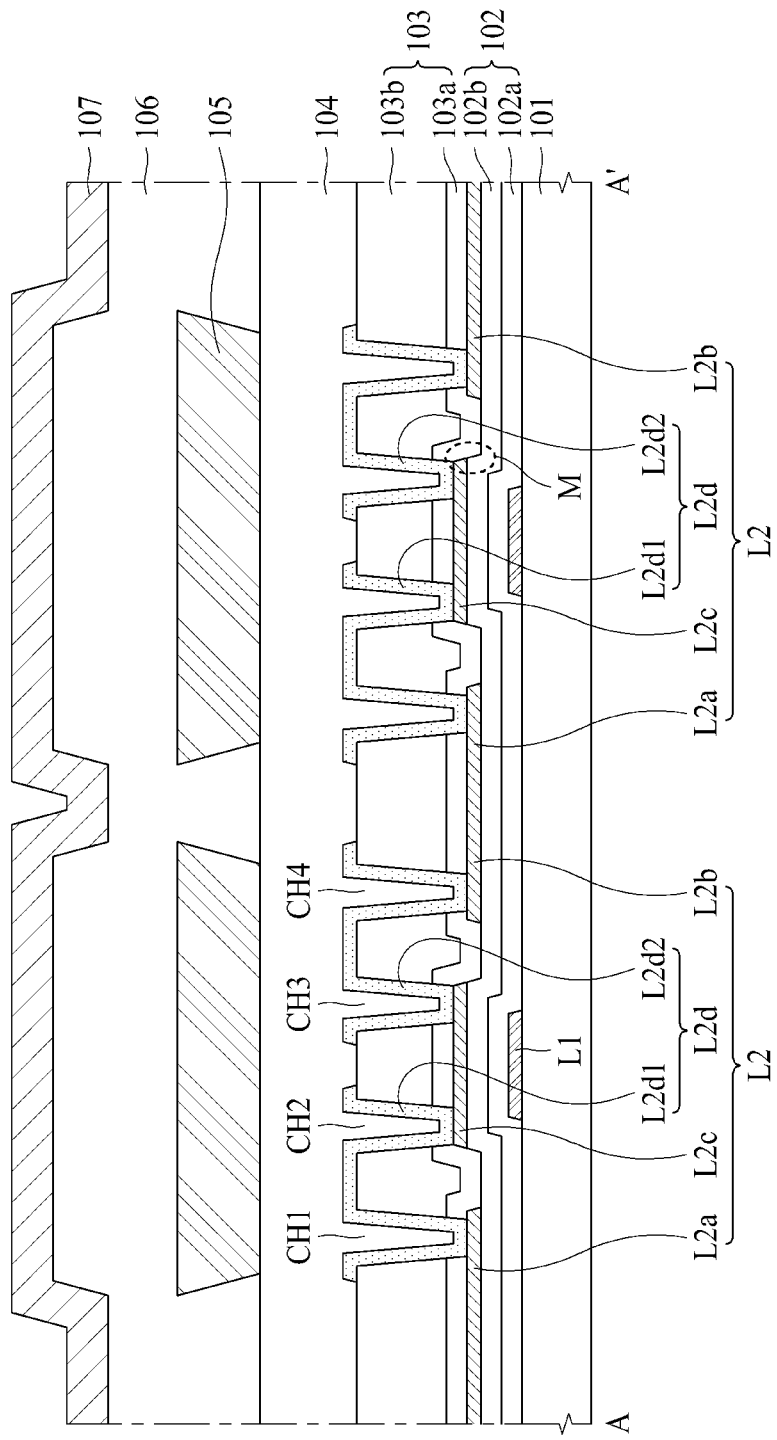

FIG. 3 illustrates four pixels of the display panel according to the present disclosure. FIG. 4 illustrates first panel electrodes provided in the pixels shown in FIG. 3. FIG. 5 illustrates second panel electrodes provided in the pixels shown in FIG. 3. FIG. 6 illustrates third panel electrodes provided in the pixels shown in FIG. 3. FIGS. 7A and 7B are cross sectional views along A-A' of FIG. 3.

As shown in FIGS. 3 to 7B, the display panel according to the present disclosure includes a substrate 101, a first signal line L1 disposed along a first direction of the substrate 101 and provided on the first substrate 101, a first insulating film 102 disposed on the substrate 101 and configured to cover the first signal line L1, a second signal line L2 disposed along a second direction different from the first direction, a second insulating film 103 configured to cover the first insulating film 102, and a first pixel electrode disposed on the second insulating film 103 and electrically connected to a transistor disposed on the first insulating film 102.

The second signal line L2 may include an extension line L2a which is disposed on a first side of the first signal line L1 with respect to the first signal line L1 which intersects the second signal line L2 and is provided on the first insulating film 102, a connection line L2b disposed on a second side of the first signal line L1 and provided on the first insulating film 102, an overlapping line L2c overlapping the first signal line with the first insulating film 102 interposed in-between, and a bridge portion L2d disposed on the second insulating film. And, the bridge portion L2d may be connected to the extension line L2a, the connection line L2b, and the overlapping line L2c through contact holes CH1 to CH4 provided on the second insulating film 103.

As shown in FIG. 1, the display panel according to the present disclosure may include the plurality of pixels 110. In FIG. 3, the four pixels constituting a unit pixel are shown. FIG. 3 shows a red pixel representing a red (R) color, a blue pixel representing a blue (B) color, a white pixel representing a white (W) color, and a green pixel representing a green (G) color.

Each pixel may include the pixel driving circuit PDC, and the light emitting portion EU. In the pixel driving circuit PDC for each of the pixels shown in FIG. 3, as shown in FIG. 2A, there are the switching transistor Tsw1, the driving transistor Tdr, and the sensing transistor Tsw2. The light emitting portion EU may be formed of the light emitting device ED, and the light emitting device ED may be formed of a light emitting diode. And, the light emitting diode may be an organic light emitting diode or an inorganic light emitting diode. However, the present disclosure is not limited to this, and may be a light emitting diode with organic or inorganic material.

In each of the pixels, there are signal lines configured to supply various signals to the pixel driving circuit PDC. For example, the display panel shown in FIG. 3 may include a data line DL, a gate line GL, a first voltage supply line PLA, a sensing line SL, and a sensing control line SCL.

In the present disclosure, the first signal line L1 may be any one of the signal lines provided in the display panel 100 along the first direction (for example, vertical direction) of the display panel 100 shown in FIG. 1. For example, each of the data line DL, the first voltage supply line PLA, and the sensing line SL may be the first signal line L1.

Also, the second signal line L2 may be any one of the signal lines provided in the display panel 100 along the second direction (the direction different from the first direction) of the display panel 100 shown in FIG. 1. For example, each of the gate line GL and the sensing control line SCL may be the second signal line L2. The second direction may be a horizontal direction.

The present disclosure may be embodied in that any one of the first signal line and the second signal line includes the bridge portion in the area where the first signal line L1 and the second signal line L2 intersect each other.

In the following description, the display panel with the second signal line having the bridge portion is described as an example of the present disclosure.

Referring to FIG. 3, the area where the first signal line L1 and the second signal line L2 intersect each other may be represented by K1 to K6.

For example, in the first intersection area indicated by K1, the two data lines DL intersect the gate line GL. Herein, each of the two data lines DL may be the first signal line, and the gate line GL may be the second signal line.

In the second intersection area indicated by K2, the sensing line SL intersects the gate line GL. At this time, the sensing line SL may be the first signal line, and the gate line GL may be the second signal line.

In the third intersection area indicated by K3, the two data lines DL intersect the gate line GL, in the same manner as the first intersection area K1. Thus, the description of the first intersection area K1 may be equally applied to the third intersection area K3.

In the fourth intersection area indicated by K4, the two data lines DL intersect the sensing control line SCL. Herein, each of the two data lines DL may be the first signal line, and the sensing control line SCL may be the second signal line.

In the fifth intersection area indicated by K5, the sensing line SL intersects the sensing control line SCL. Herein, the sensing line SL may be the first signal line, and the sensing control line SCL may be the second signal line.

In the sixth intersection area indicated by K6, the two data lines DL intersect the sensing control line SCL, in the same manner as the fourth intersection area K4.

In the area where the two signal lines L1 and L2 intersect each other, one of the two signal lines L1 and L2 includes the bridge portion L2d. Also, these features may be implemented in the first intersection area K1 to the sixth intersection area K6.

In the resistance-capacitor load (hereinafter, referred to as RC load) generated when the two signal lines L1 and L2 intersect each other, the RC load affecting the defect of the display panel is the RC load generated in the area where the data line DL and the gate line GL intersect each other.

Hereinafter, for convenience of explanation, the display panel where the first signal line L1 is the data line DL and the second signal line L2 is the gate line GL is described as an example of the present disclosure.

As described above, the area where the data line DL and the gate line GL intersect each other is the first intersection area K1 and the third intersection area K3. Accordingly, an embodiment of the present specification will be described with reference to the first intersection area K1.

FIGS. 7A and 7B are cross sectional views along A-A' in the first intersection area K1 shown in FIG. 3.

The substrate 101 may be a glass substrate or a plastic substrate, and may be formed of various kinds of films.

As shown in FIG. 4, first panel electrodes may be formed on the substrate 101. Some of the first panel electrodes may be the data line DL used as the first signal line L1. That is, the first signal line L1, which is one of the first panel electrodes, is illustrated in FIGS. 7A and 7B, and the first signal line L1 may be the data line DL.

The data voltage Vdata generated from the data driver 300 may be supplied to the data line DL. The data voltage Vdata may be supplied to the transistor provided in the pixel driving circuit. For example, as shown in FIGS. 2A and 2B, the data voltage Vdata may be supplied to the switching transistor Tsw1 or the switching transistor Tsw.

The first signal line L1 may be disposed in the first direction of the substrate 101. For example, the first signal line L1 may be provided along the vertical direction of the display panel shown in FIG. 1.

The first signal line L1 may be covered by the first insulating film 102.

The first insulating film 102 may include a buffer 102a which contacts the first signal line L1, and a gate insulating film 102b which covers the buffer 102a.

The buffer 102a may be provided on the substrate 101.

The gate insulating film 102b may be formed on an upper surface of the buffer 102a. The gate insulating film 102b may be disposed between an active layer of the driving transistor Tdr and a gate electrode of the driving transistor Tdr provided in the pixel driving circuit PDC. The gate insulating film 102b may be disposed to cover the active layer on the buffer 102a. And, the gate electrode of the driving transistor Tdr may be disposed on the gate insulating film 102b.

A thickness of the buffer 102a located in an overlap area with the first signal line L1 may be greater than a thickness of the buffer 102a located in an overlap area with the driving transistor Tdr or other transistors other than the driving transistor Tdr. Therefore, a thickness of the first insulating film 102 located in an area overlapping the first signal line L1 may be greater than a thickness of the first insulating film 102 located in an area overlapping the driving transistor Tdr. That is, a thickness of the first insulating film 102 disposed between the first signal line L1 and the overlapping line L2c may be greater than a thickness of the first insulating film 102 disposed in an overlap area with the driving transistor Tdr or other transistors other than the driving transistor Tdr.

A thickness of the gate insulating film 102b provided on an upper end of the first signal line L1 may be greater than a thickness of the gate insulating film 102b in an area where the driving transistor Tdr is provided. For example, a thickness of the gate insulating film 102b located in an area overlapping the first signal line L1 may be greater than a thickness of the gate insulating film 102b located in an area overlapping the driving transistor Tdr.

This thickness difference may be formed by a process of etching the buffer 102a or the gate insulating film 102b through the use of halftone mask (H/T Mask).

The buffer 102a may be formed of at least one inorganic film or at least one organic film. Alternatively, the buffer 102a may be formed by stacking at least one inorganic film and at least one organic film.

The gate insulating film 102b may be formed of at least one inorganic film or at least one organic film. Alternatively, the gate insulating film 102b may be formed by stacking at least one inorganic film and at least one organic film.

As shown in FIG. 5, second panel electrodes may be formed on an upper end of the first insulating film 102. Some of the second panel electrodes may be the second signal line L2, and the second signal line L2 may be the gate line GL. The second panel electrodes may include an extension line L2a, a connection line L2b, and an overlapping line L2c constituting the second signal line L2.

The second signal line L2 may be the gate line GL. The extension line L2a may be disposed on the first side of the first signal line L1 with respect to the first signal line L1 intersecting the second signal line L2. The second signal line L2 may include the extension line L2a on the first insulating film 102, the connection line L2b disposed on the second side of the first signal line L1 and provided on the first insulating film 102, the overlapping line L2c disposed on the first insulating film 102 and overlapping the first signal line L1, and a bridge portion L2d on the second insulating film 103. The bridge portion L2d may be connected to the extension line L2a, the connection line L2b, and the overlapping line L2c through contact holes provided on the second insulating film 103.

Some of the second panel electrodes shown in FIG. 5 may be the extension line L2a, the connection line L2b, and the overlapping line L2c, as shown in FIGS. 7A and 7B. Referring to FIGS. 7A and 7B, the left side of the first signal line L1 is referred to as the first side, and the right side of the first signal line L1 may be referred to as the second side. The extension line L2a is disposed on the first side of the first signal line L1, and the connection line L2b may be disposed on the second side of the first signal line L1. The overlapping line L2c may be disposed to overlap the first signal line L1.

As shown in FIGS. 7A and 7B, the second panel electrode provided between the two first signal lines L1 may be the connection line L2b with respect to the first signal line L1 intersecting the second signal line L2 provided on the right side. And, the second panel electrode may be the extension line L2a with respect to the first signal line L1 intersecting the second signal line L2 provided on the left side.

The second signal line L2 may include the extension lines L2a, the connection lines L2b, and the overlapping lines L2c. The extension lines L2a, the connection lines L2b, and the overlapping lines L2c may be arranged in the second direction different from the first direction. The second insulating film 103 may be disposed on the first insulating film 102, and the second insulating film 103 may cover the first insulating film 102. As shown in FIGS. 7A and 7B, the extension lines L2a, the connection lines L2b, and the overlapping lines L2c disposed on the first insulating film 102 may be also covered by the second insulating film 103.

The second insulating film 103 may include a protection film 103a disposed on the extension lines L2a, the connection lines L2b and the overlapping lines L2c, and a planarization film 103b disposed on the protection film 103a. The protection film 103a may protect the extension lines L2a, the connection lines L2b, and the overlapping lines L2c, or may insulate the extension lines L2a, the connection lines L2b, and the overlapping lines L2c from other metal materials. And, the planarization film 103b may serve to reduce a step difference generated by elements disposed under the planarization film 103b.

For example, various kinds of transistors and signal lines constituting the pixel driving circuit PDC may be provided between the first insulating film 102 and the second insulating film 103. In this case, the various kinds of transistors and signal lines may have different thicknesses, and the thickness of the area in which the transistors and the signal lines are provided may be different from the thickness of the area in which the transistors and the signal lines are not provided.

Due to the step difference formed by the transistors and the signal lines, an upper surface of the protection film 103a covering the transistors and the signal lines may be uneven.

The planarization film 103b is formed on the upper surface of the protection film 103a and is configured to planarize the uneven upper surface. The planarization film 103b is configured to have a thickness greater than that of the protection film 103a, whereby an upper surface of the planarization film 103b may form a planarized surface.

The protection film 103a may be formed of at least one inorganic film.

The planarization film 103b may be formed of at least one organic film or may be formed in a stack structure of at least one inorganic film and at least one organic film.

As shown in FIG. 6, third panel electrodes may be formed on an upper end of the second insulating film 103. Some of the third panel electrodes may be the gate line GL used as the second signal line L2. In particular, the third panel electrodes may include the bridge portion L2d configured to form the second signal line L2.

Some of the third panel electrodes shown in FIG. 6 may be the bridge portion L2d, as shown in FIGS. 7A and 7B.

The bridge portion L2d may be disposed on the second insulating film 103. The bridge portion L2d may be connected to the extension line L2a, the connection line L2b, and the overlapping line L2c through contact holes CH1, CH2, CH3, CH4 formed on the second insulating film.

For example, the bridge portion L2d may include a first bridge L2d1 connected to the extension line L2a and the overlapping line L2c, and a second bridge L2d2 connected to the connection line L2b and the overlapping line L2c.

The first bridge L2d1 may be connected to the extension line L2a through the first contact hole CH1 formed on the second insulating film 103, and may be connected to the overlapping line L2c through the second contact hole CH2 formed on the second insulating film 103.

The second bridge L2d2 may be connected to the connection line L2b through the fourth contact hole CH4 formed on the second insulating film 103, and may be connected to the overlapping line L2c through the third contact hole CH3 formed on the second insulating film 103.

The overlapping line L2c may be connected to the first bridge L2d1 through the second contact hole CH2, and may be connected to the second bridge L2d2 through the third contact hole CH3.

The extension line L2a is connected to the first bridge L2d1 through the first contact hole CH1, the first bridge L2d1 is connected to the overlapping line L2c through the second contact hole CH2, the overlapping line L2c is connected to the second bridge L2d2 through the third contact hole CH3, and the second bridge L2d2 may be connected to the connection line L2b through the fourth contact hole CH4. Accordingly, the extension line L2a and the connection line L2b, which are separated from each other with the first signal line L1 therebetween, may be electrically connected by the first bridge L2d1 connected to the extension line L2a and the overlapping line L2c, and the second bridge L2d2 connected to the overlapping line L2c and the connection line L2b.

Therefore, a parasitic capacitance generated between the first signal line L1 and the second signal line L2 may be reduced, and the second signal line L2 intersecting the first signal line L1 may be formed.

In the area of the first insulating film 102 where the first signal line L1 and the overlapping line L2c are provided, the overlapping line L2c, the extension line L2a and the connection line L2b are not disposed on an inclined surface M of the first insulating film which is inclined by the first signal line L1 (hereinafter, referred to as the first insulating film inclined surface M).

Accordingly, the parasitic capacitance caused by the overlap between the first signal line L1 and the second signal line L2 is not generated in the first insulating film inclined surface M. Therefore, the RC load of the data voltage Vdata transmitted along the data line DL or the gate signal GS transmitted along the gate line GL may be reduced.

For example, in the first intersection area K1, the first signal line L1 is overlapped only with the overlapping line L2c configured to form the second signal line L2, whereby the RC load in each of the gate line GL and the data line DL may be reduced compared to the RC load in each of the gate line and the data line in the related art display panel in which the second signal line L2 is formed on the first insulating film inclined surface M. Accordingly, defects on image quality caused by the RC load may be reduced in the present disclosure.

Also, as described above, the thickness of the buffer 102a disposed on the first signal line L1 may be greater than the thickness of the buffer disposed on the driving transistor Tdr.

Accordingly, the parasitic capacitance between the first signal line L1 and the overlapping line L2c may also be reduced. Therefore, due to the increase of RC load according to the data line or the gate signal GS transmitted along the gate line GL (high resolution and mask reduction), the decrease in a charging rate may occur in the related art display panel. Due to the increase in the RC load, image quality is deteriorated.

For example, the RC load may increase due to the parasitic capacitance generated between the data line and the gate line which intersect each other. Especially, as the width of the signal line decreases, the RC load may increase due to the parasitic capacitance generated between the data line and the gate line which are overlapped on the first insulating film inclined surface M. In order to prevent this, the intersection area between the data line and the gate line has to be reduced.

Therefore, in the present disclosure, the second signal line L2 is not provided on the first insulating film inclined surface M, and the first signal line L1 is overlapped only with the overlapping line L2c constituting the second signal line L2.

In addition, in the present disclosure, the thickness of the first insulating film 102 provided on the upper end of the first signal line L1 is greater than the thickness of the first insulating film 102 provided in the area where the driving transistor is provided.

In this case, the increase of capacitance is required to improve the charging rate of the storage capacitor Cst in the area where the driving transistor is provided, so that the buffer 102a and the gate insulating film 102b provided on the upper end of the driving transistor may be smaller in thickness than the buffer 102a and the gate insulating film 102b located between the first signal line L1 and the overlapping line L2c, preferably.

Since the parasitic capacitance between the first signal line L1 and the overlapping line L2c increases as the thickness of the first insulating film 102 becomes small, the thickness of the first insulating film 102 located in the area overlapping the first signal line L1 is greater than the thickness of the first insulating film 102 located in the area overlapping the driving transistor Tdr.

When the thickness of the first insulating film 102 increases, the length of the first insulating film inclined surface M may be increased. In the present disclosure, the second signal line L2 is not formed on the first insulating film inclined surface M, the parasitic capacitance may be reduced on the lateral side of the first signal line L1.

Some of the third panel electrodes disposed on the second insulating film 103 may be formed of the first pixel electrode for the light emitting portion EU, as shown in FIGS. 3 and 6.

The first pixel electrode may be any one of the two electrodes constituting the light emitting device ED. For example, when the light emitting device ED is an organic light emitting diode, the organic light emitting diode may include a first pixel electrode, a light emitting layer provided on an upper end of the first pixel electrode, and a second pixel electrode provided on an upper end of the light emitting layer. The first pixel electrode may be an anode, and the second pixel electrode may be a cathode. In this case, the first pixel electrode is connected to the driving transistor Tdr.

That is, the first pixel electrode disposed on the second insulating film 103 may be electrically connected to the transistor disposed under the second insulating film 103. For example, the first pixel electrode may be electrically connected to the driving transistor Tdr disposed on the lower surface of the second insulating film through the contact hole of the second insulating film.

The bridge portion L2d may be covered by a bank 104 configured to form an opening through which light is output.

A partition 105 may be additionally formed on an upper end of the bridge portion L2d of the bank 104.

A cathode 107 may be formed on an upper end of the bank 104. A light emitting layer 106 may be formed between the bank 104 and the cathode 107. When the partition 105 is provided additionally, the light emitting layer 106 may be provided between the bank 104 and partition 105 and the cathode 107.

When the light emitting device ED is an organic light emitting diode, the organic light emitting diode may include an anode, a light emitting layer provided on an upper end of the anode, and a cathode provided on an upper end of the light emitting layer. In this case, the anode may be patterned to be disposed in each of the plurality of pixels. The cathode 107 may be formed on the entire display area 120. Alternatively, it is patterned to be disposed only in the area for the anode. The light emitting layer 106 may also be provided on the entire surface of the display area 120. Alternatively, the light emitting layer 106 may be patterned and formed only in the area corresponding to the anode. In FIGS. 7A and 7B, the display panel including the light emitting layer 106 provided in the display area 120 of the substrate 101 is shown as one example of the present disclosure.

A bank 104 may be provided in the periphery of the light emitting portion EU. The bank 104 may define a light emitting area. For example, light generated in an area (hereinafter, simply referred to as an opening) of the light emitting portion EU, which is not covered by the bank 104, may be output to the outside of the display panel. Accordingly, the area which is not covered by the bank 104 in the display area 120 of the substrate 101 may be defined as the light emitting area. The bank 104 may cover the bridge portion L2d.

An interval between the bridge portion L2d and the cathode 107 when there is no partition 105 is smaller than an interval between the bridge portion L2d and the cathode 107 when the partition 105 is provided.

If the interval between the bridge portion L2d and the cathode 107 decreases, a parasitic capacitance may be generated between the bridge portion L2d and the cathode 107. Accordingly, the RC load may be increased in each of the bridge portion L2d and the cathode 107. Since the bridge portion L2d is formed of metal, a parasitic capacitance may be generated between the cathode 107 formed of metal and the bridge portion L2d formed of metal. Accordingly, the RC load may be increased.

In order to prevent this, as shown in FIG. 7B, the partition 105 may be provided between the bank 104 and the cathode 107, and the partition 105 may be overlapped with the bridge portion L2d.

However, if the parasitic capacitance between the cathode 107 and the bridge portion L2d is not large, the partition 105 may not be provided, as shown in FIG. 7A.

Figure 8:
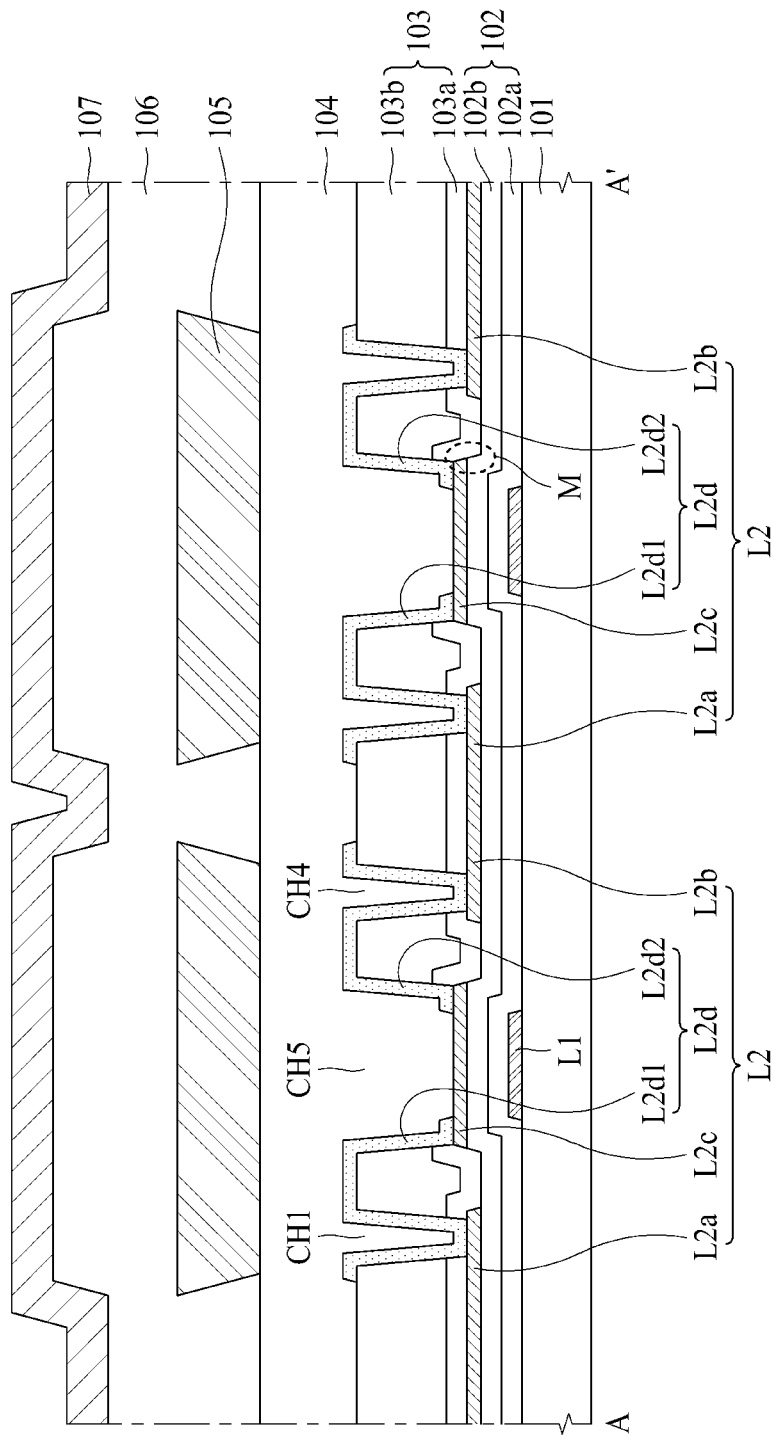
FIG. 8 is another cross sectional view along A-A' of FIG. 3.

FIG. 8 is another cross sectional view along A-A' of FIG. 3. In the following description, the same or similar explanation as described with reference to FIGS. 1 to 7B is omitted or briefly described.

As described with reference to FIGS. 1 to 7B, a display panel according to the present disclosure includes a substrate 101, a first signal line L1 disposed along a first direction of the substrate 101, a first insulating film 102 disposed on the substrate 101 and configured to cover the first signal line L1, a second signal line L2 disposed along a second direction different from the first direction, a second insulating film 103 configured to cover the first insulating film 102, and a first pixel electrode disposed on the second insulating film 103 and electrically connected to a transistor disposed on the first insulating film 102.

The second signal line L2 may include an extension line L2a which is disposed on a first side of the first signal line L1 with respect to the first signal line L1 which intersects the second signal line L2 and is provided on the first insulating film 102, a connection line L2b disposed on a second side of the first signal line L1 and provided on the first insulating film 102, an overlapping line L2c disposed on the first insulating film 102 and overlapped with the first signal line, and a bridge portion L2d disposed on the second insulating film. And, the bridge portion L2d may be connected to the extension line L2a, the connection line L2b, and the overlapping line L2c through contact holes CH1 to CH4 provided on the second insulating film 103.

A fifth contact hole CH5 through which the overlapping line L2c is exposed may be formed on the second insulating film 103. The bridge portion L2d may include a first bridge L2d1 connected to the extension line L2a through the first contact hole CH1 formed on the second insulating film 103 and connected to the overlapping line L2c through the fifth contact hole CH5, and a second bridge L2d2 connected to the connection line L2b through the fourth contact hole CH4 formed on the second insulating film 103 and connected to the overlapping line L2c through the fifth contact hole CH5.

For example, in the display panel shown in FIGS. 7A and 7B, the extension line L2a is connected to the first bridge L2d1 through the first contact hole CH1, the first bridge L2d1 is connected to one side of the overlapping line L2c through the second contact hole CH2, the other side of the overlapping line L2c is connected to the second bridge L2d2 through the third contact hole CH3, and the second bridge L2d2 is connected to the connection line L2b through the fourth contact hole CH4, whereby the extension line L2a and the connection line L2b, which are separated from each other with the first signal line L1 therebetween, may be electrically connected with each other.

However, in the display panel shown in FIG. 8, the extension line L2a is connected to the first bridge L2d1 through the first contact hole CH1, the first bridge L2d1 is connected to one side of the overlapping line L2c through the fifth contact hole CH5, the other side of the overlapping line L2c is connected to the second bridge L2d2 through the fifth contact hole CH5, and the second bridge L2d2 is connected to the connection line L2b through the fourth contact hole CH4, whereby the extension line L2a and the connection line L2b, which are separated from each other with the first signal line L1 therebetween, may be electrically connected with each other.

In the display panel shown in FIGS. 7A and 7B, the first bridge L2d1 and the second bridge L2d2 are connected to the overlapping line L2c through the different contact holes CH2 and CH3. However, in the display panel shown in FIG. 8, the first bridge L2d1 and the second bridge L2d2 are connected to the overlapping line L2c through one contact hole, that is, the fifth contact hole CH5.

Accordingly, in comparison to the display panel shown in FIGS. 7A and 7B, one contact hole may be reduced in the display panel shown in FIG. 8. Also, the first bridge L2d1 and the second bridge L2d2 are disposed on the upper end of the planarization film 103b in the display panel shown in FIGS. 7A and 7B, however, the overlapping line L2c is exposed through the fifth contact hole CH5 from which the planarization film 103b is removed in the display panel shown in FIG. 8. Thus, the interval between the overlapping line L2c and the cathode 107 shown in FIG. 8 may be larger than the interval between the first bridge L2d1/second bridge L2d2 and the cathode 107 shown in FIGS. 7A and 7B. Accordingly, in comparison to the display panel shown in FIGS. 7A and 7B, the parasitic capacitance between the cathode 107 and the gate line used as the second signal line L2 may be reduced.

In the area of the first insulating film 102 where the first signal line L1 and the overlapping line L2c are provided, the overlapping line L2c, the extension line L2a and the connection line L2b are not disposed on the inclined surface M of the first insulating film which is inclined by the first signal line L1.

Accordingly, the occurrence of parasitic capacitance due to the overlap of the first signal line L1 and the second signal line L2 may be prevented or reduced in the first insulating film inclined surface M. Therefore, the RC load of the data voltage Vdata transmitted along the data line DL or the gate signal GS transmitted along the gate line GL may be reduced.

In addition, the thickness of the buffer 102a provided on the upper end of the first signal line L1 may be greater than the thickness of the buffer provided in the area in which the driving transistor Tdr is provided, thereby reducing the parasitic capacitance between the first signal line L1 and the overlapping line L2c. Therefore, the RC load of the data voltage Vdata transmitted along the data line DL or the gate signal GS transmitted along the gate line GL may be reduced.

Further, the bridge portion L2d is covered by the bank 104 configured to form the opening through which light is output, and the partition 105 may be formed on an upper end of the bridge portion L2d of the bank 104. In this case, the cathode 107 may be provided on an upper end of the bank 104, and the light emitting layer 106 may be disposed between the bank 104 and the cathode 107.

That is, in order to increase an interval between the bridge portion L2d and the cathode 107, the partition 105 may be provided between the bank 104 and the cathode 107, and the partition 105 may be overlapped with the bridge portion L2d, thereby reducing RC load in the cathode 107 and the bridge portion L2d.

However, if the parasitic capacitance between the cathode and the bridge portion L2d is not large, the partition 105 may not be provided.

Figure 9:
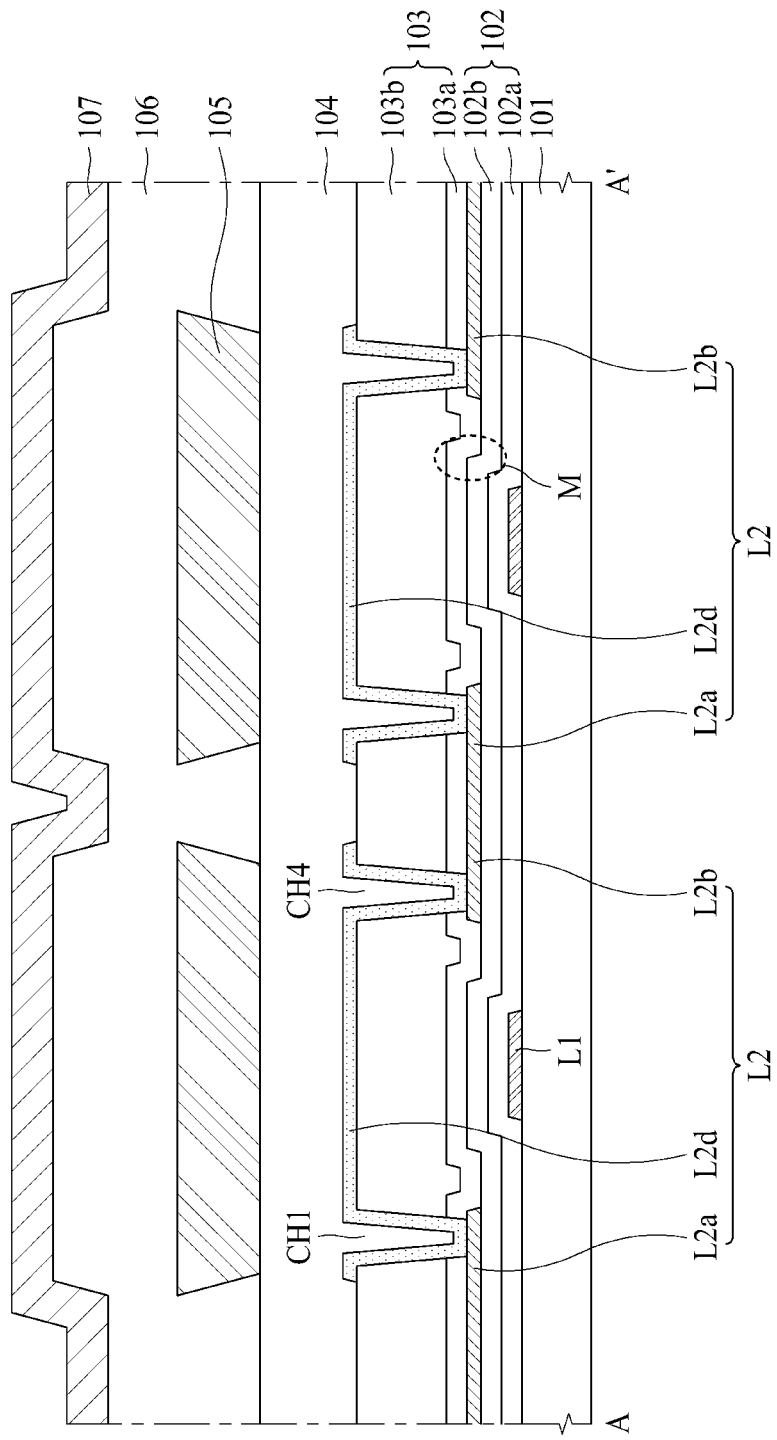
FIG. 9 is another cross sectional view along A-A' of FIG. 3.

FIG. 9 is another cross sectional view along A-A' of FIG. 3. In the following description, the same or similar explanation as described with reference to FIGS. 1 to 8 is omitted or briefly described.

As described with reference to FIGS. 1 to 8, a display panel according to the present disclosure includes a substrate 101, a first signal line L1 disposed along a first direction of the substrate 101 and provided on the substrate 101, a first insulating film 102 disposed on the substrate 101 and configured to cover the first signal line L1, a second signal line L2 disposed along a second direction different from the first direction, a second insulating film 103 configured to cover the first insulating film 102, and a first pixel electrode disposed on the second insulating film 103 and electrically connected to a transistor disposed on the first insulating film 102.

Referring to FIGS. 1 to 8, the second signal line L2 may include an extension line L2a which is disposed on a first side of the first signal line L1 with respect to the first signal line L1 which intersects the second signal line L2 and is provided on the first insulating film 102, a connection line L2b disposed on a second side of the first signal line L1 and provided on the first insulating film 102, an overlapping line L2c disposed on the first insulating film 102 and overlapped with the first signal line, and a bridge portion L2d disposed on the second insulating film. And, the bridge portion L2d may be connected to the extension line L2a, the connection line L2b, and the overlapping line L2c through contact holes CH1 to CH4 provided on the second insulating film 103.

In the display panel shown in FIG. 9, the second signal line L2 may include an extension line L2a which is disposed on a first side of the first signal line L1 with respect to the first signal line L1 which intersects the second signal line L2 and is provided on the first insulating film 102, a connection line L2b disposed on a second side of the first signal line L1 and provided on the first insulating film 102, and a bridge portion L2d disposed on the second insulating film. And, the bridge portion L2d may be connected to the extension line L2a and the connection line L2b through contact holes provided on the second insulating film 103.

The bridge portion L2d may be connected to the extension line L2a through the first contact hole CH1 formed on the second insulating film 103, and may be connected to the connection line L2b through the fourth contact hole CH4 formed on the second insulating film 103.

In the display panel shown in FIG. 9, the extension line L2a is connected to the bridge portion L2d through the first contact hole CH1, and the bridge portion L2d is connected to the connection line L2b through the fourth contact hole CH4, whereby the extension line L2a and the connection line L2b, which are separated from each other with the first signal line L1 therebetween, may be electrically connected with each other.

In the display panel shown in FIG. 9, the overlapping line L2c is not provided, and the bridge portion L2d is connected to the extension line L2a and the connection line L2b through the first contact hole CH1 and the fourth contact hole CH4.

Accordingly, in comparison to the display panel shown in FIGS. 7A and 7B, two contact holes may be reduced in the display panel shown in FIG. 9. Also, in comparison to the display panel shown in FIG. 8, one contact hole may be reduced in the display panel shown in FIG. 9. Furthermore, in case of the display panels shown in FIGS. 7A and 7B and FIG. 8, in the overlap area between the second signal line L2 and the first signal line L1, the overlapping line L2c is disposed on the upper end of the first insulating film 102. However, in case of the display panel shown in FIG. 9, the bridge portion L2d is disposed on the upper end of the planarization film 103b. Thus, the interval between the first signal line L1 and the bridge portion L2d shown in FIG. 9 may be larger than the interval between the overlapping line L2c and the first signal line L1 shown in FIGS. 7A, 7B and 8. Accordingly, the display panel shown in FIG. 9 may reduce the parasitic capacitance between the first signal line L1 and the second signal line L2 as compared with the display panel shown in FIGS. 7A, 7B and 8.

According to the above preset disclosure, in the area of the first insulating film 102 where the first signal line L1 is provided, the extension line L2a and the connection line L2b are not disposed on the inclined surface M of the first insulating film which is inclined by the first signal line L1.

Accordingly, the occurrence of parasitic capacitance due to the overlap of the first signal line L1 and the second signal line L2 may be prevented or reduced in the first insulating film inclined surface M. Therefore, the RC load of the data voltage Vdata transmitted along the data line DL or the gate signal GS transmitted along the gate line GL may be reduced.

In addition, the thickness of the buffer 102a provided on the upper end of the first signal line L1 may be greater than the thickness of the buffer provided in the area in which the driving transistor Tdr is provided, thereby reducing the parasitic capacitance between the first signal line L1 and the bridge portion L2d. Therefore, the RC load of the data voltage Vdata transmitted along the data line DL or the gate signal GS transmitted along the gate line GL may be reduced.

Also, the bridge portion L2d is covered by a bank 104 configured to form an opening through which light is output, and a partition 105 may be formed on an upper end of the bridge portion L2d of the bank 104. In this case, a cathode 107 may be provided on an upper end of the bank 104, and a light emitting layer 106 may be disposed between the bank 104 and partition 105 and the cathode 107.

That is, in order to increase an interval between the bridge portion L2d and the cathode 107, the partition 105 may be provided between the bank 104 and the cathode 107, and the partition 105 may be overlapped with the bridge portion L2d, thereby reducing RC load in the cathode 107 and the bridge portion L2d.

However, if the parasitic capacitance between the cathode and the bridge portion L2d is not large, the partition 105 may not be provided.

According to the present disclosure, it is possible to reduce the overlap area between the two signal lines intersecting each other, whereby it is possible to reduce the parasitic capacitance between the two signal lines intersecting each other.

Especially, according to the present disclosure, the lateral surfaces of the first signal line provided in the lower end of the two signal lines intersecting each other are not covered by the second signal line provided in the upper end of the two signal lines intersecting each other so that it is possible to reduce the parasitic capacitance between the two signal lines.

Accordingly, defects on image quality caused by the RC load may be reduced in the present disclosure.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display panel comprising:
   a substrate;
   a first signal line disposed along a first direction of the substrate and provided on the substrate;
   a first insulating film disposed on the substrate and covering the first signal line;
   a second signal line disposed along a second direction different from the first direction, the second signal line intersecting the first signal line;
   a second insulating film covering the first insulating film; and
   a first pixel electrode disposed on the second insulating film and electrically connected to a transistor disposed on the first insulating film,
   wherein the second signal line includes:
   an extension line disposed on a first side of the first signal line and provided on the first insulating film;
   a connection line disposed on a second side of the first signal line and provided on the first insulating film;
   an overlapping line disposed on the first insulating film and overlapped with the first signal line; and
   a bridge portion disposed on the second insulating film and connected to the extension line, the connection line, and the overlapping line through contact holes in the second insulating film.

2. The display panel according to claim 1, wherein the first signal line is a data line, and the second signal line is a gate line.

3. The display panel according to claim 1, wherein the bridge portion includes:
   a first bridge connected to the extension line and the overlapping line; and
   a second bridge connected to the connection line and the overlapping line.

4. The display panel according to claim 3,
   wherein the first bridge is connected to the extension line through a first contact hole in the second insulating film and is connected to the overlapping line through a second contact hole disposed on the second insulating film, and
   the second bridge is connected to the connection line through a fourth contact hole disposed on the second insulating film, and is connected to the overlapping line through a third contact hole disposed on the second insulating film.

5. The display panel according to claim 1,
   wherein a fifth contact hole through which the overlapping line is exposed is disposed on the second insulating film, and
   wherein the bridge portion includes:
   a first bridge connected to the extension line through a first contact hole disposed on the second insulating film and connected to the overlapping line through the fifth contact hole; and
   a second bridge connected to the connection line through a fourth contact hole in the second insulating film, and connected to the overlapping line through the fifth contact hole.

6. The display panel according to claim 5, wherein the first bridge and the second bridge are connected with each other or separated from each other on an upper surface of the overlapping line.

7. The display panel according to claim 1, wherein, in the area of the first insulating film where the first signal line and the overlapping line are provided, the overlapping line, the extension line and the connection line are not disposed on an inclined surface of the first insulating film which is inclined by the first signal line.

8. The display panel according to claim 1,
   wherein a light emitting layer is disposed on an upper end of the first pixel electrode, and
   a second pixel electrode is disposed on an upper end of the light emitting layer.

9. The display panel according to claim 1,
   wherein the bridge portion is covered by a bank including an opening in which light is output, a partition is disposed on an upper end of the bridge portion of the bank, a cathode is disposed on an upper end of the bank, and a light emitting layer is disposed between the bank/partition and the cathode.

10. The display panel according to claim 1, wherein a thickness of the first insulating film between the first signal line and the overlapping line is larger than a thickness of the first insulating film in the area where the transistor is disposed.

11. A display apparatus comprising:

the display panel according to claim 1;

a data driver configured to supply data voltages to data lines disposed in the display panel;

a gate driver configured to supply gate voltages to gate lines disposed in the display panel; and a controller configured to control the data driver and the gate driver.

\* \* \* \* \*